US012761160B2

(12) United States Patent
Voleti et al.

(10) Patent No.: US 12,761,160 B2
(45) Date of Patent: Oct. 13, 2026

(54) MULTIDIRECTIONAL ILLUMINATION FOR HYBRID BONDING DEFECT DETECTION

(71) Applicant: Applied Materials, Inc., Santa Clara, CA (US)

(72) Inventors: Venkatakaushik Voleti, San Jose, CA (US); Mehdi Vaez-Iravani, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 127 days.

(21) Appl. No.: 18/798,303

(22) Filed: Aug. 8, 2024

(65) Prior Publication Data

US 2025/0076212 A1 Mar. 6, 2025

Related U.S. Application Data

(60) Provisional application No. 63/536,366, filed on Sep. 1, 2023.

(51) Int. Cl.
*G01N 21/88* (2006.01)
*G01N 21/47* (2006.01)
(Continued)

(52) U.S. Cl.
CPC ..... *G01N 21/8851* (2013.01); *G01N 21/4738* (2013.01); *G01N 21/8806* (2013.01);
(Continued)

(58) Field of Classification Search
CPC ........... G01N 21/8851; G01N 21/4738; G01N 21/8806; G01N 21/9501; G01N 21/9505;
(Continued)

(56) References Cited

U.S. PATENT DOCUMENTS 5,129,009 A 7/1992 Lebeau
5,798,829 A 8/1998 Vaez-Iravani
(Continued)

FOREIGN PATENT DOCUMENTS

CN 116399869 A 7/2023
JP H09189531 A 7/1997
(Continued)

OTHER PUBLICATIONS

International Search Report and Written Opinion dated Nov. 26, 2024 for Application No. PCT/US2024/041651.
(Continued)

*Primary Examiner* — Tony Ko
(74) *Attorney, Agent, or Firm* — Patterson + Sheridan, LLP

(57) ABSTRACT

An optical inspection system for pre-bonding inspection system includes a stage on which a sample to be inspected is placed, a sensor, optical assemblies, each including an optical head having optics to direct a sample field-of-view (FOV) to a portion of the sample, a first light source configured to illuminate the sample at a first oblique angle, a second light source configured to illuminate the sample at a second oblique angle, a focusing lens to focus a first optical image of the portion of the sample generated by the first light source, and a second optical image of the portion of the sample generated by the second light source onto a segment of the sensor, and a controller configured to combine the first optical image and the second optical image generated by each optical assembly, and generate a map of point defects on the sample.

20 Claims, 10 Drawing Sheets

(51) Int. Cl.
*G01N 21/95* (2006.01)
*H10P 74/00* (2026.01)
*H10P 74/20* (2026.01)
*H10W 80/00* (2026.01)

(52) U.S. Cl.
CPC ..... *G01N 21/9501* (2013.01); *G01N 21/9505* (2013.01); *H10P 74/203* (2026.01); *H10P 74/235* (2026.01); *H10P 74/238* (2026.01); *H10P 74/277* (2026.01); *G01N 2021/8809* (2013.01); *G01N 2021/8864* (2013.01); *G01N 2201/06113* (2013.01); *G01N 2201/06153* (2013.01); *G01N 2201/062* (2013.01); *H10W 80/161* (2026.01); *H10W 80/312* (2026.01); *H10W 80/327* (2026.01)

(58) Field of Classification Search
CPC ... G01N 2021/8809; G01N 2021/8864; G01N 2201/06113; G01N 2201/06153; G01N 2201/062; G01N 2021/8825; H10P 74/203; H10P 74/235; H10P 74/238; H10P 74/277; H10W 80/161; H10W 80/312; H10W 80/327; H10W 72/90
See application file for complete search history.

(56) References Cited

U.S. PATENT DOCUMENTS

| | | | |
|---|---|---|---|
| 6,198,529 B1 | 3/2001 | Clark, Jr. et al. | |
| 6,578,961 B2 | 6/2003 | Vaez-Iravani | |
| 6,710,876 B1 | 3/2004 | Nikoonahad et al. | |
| 6,724,473 B2 | 4/2004 | Leong et al. | |
| 6,781,688 B2 | 8/2004 | Kren et al. | |
| 6,862,096 B2 | 3/2005 | Vaez-Iravani et al. | |
| 6,922,236 B2 | 7/2005 | Vaez-Iravani et al. | |
| 7,068,363 B2 | 6/2006 | Bevis et al. | |
| 7,088,443 B2 | 8/2006 | Vaez-Iravani et al. | |
| 7,116,413 B2 | 10/2006 | Vaez-Iravani | |
| 7,218,392 B2 | 5/2007 | Biellak et al. | |
| 7,295,303 B1 | 11/2007 | Vaez-Iravani et al. | |
| 7,319,229 B2 | 1/2008 | Vaez-Iravani et al. | |
| 7,345,752 B1 | 3/2008 | Kadkly et al. | |
| 7,345,754 B1 | 3/2008 | Zhao et al. | |
| 7,385,688 B1 | 6/2008 | Kadkly et al. | |
| 7,525,649 B1 | 4/2009 | Leong et al. | |
| 7,623,229 B1 | 11/2009 | Vaez-Iravani et al. | |
| 7,679,735 B2 | 3/2010 | Lewis et al. | |
| 7,709,794 B2 | 5/2010 | Zhao et al. | |
| 7,733,111 B1 | 6/2010 | Zhao et al. | |
| 7,746,459 B2 | 6/2010 | Kadkly et al. | |
| 7,782,452 B2 | 8/2010 | Mehanian et al. | |
| 7,869,023 B2 | 1/2011 | Zhao et al. | |
| 7,978,323 B2 | 7/2011 | Miller et al. | |
| 7,989,729 B1 | 8/2011 | Zhao et al. | |
| 8,194,240 B1 | 6/2012 | Vaez-Iravani et al. | |
| 8,194,301 B2 | 6/2012 | Zhao et al. | |
| 8,283,631 B2 | 10/2012 | Vaez-Iravani et al. | |
| 8,765,496 B2 | 7/2014 | Nasser-Ghodsi et al. | |
| 9,052,190 B2 | 6/2015 | Salehpour et al. | |
| 9,086,389 B2 | 7/2015 | Kavaldjiev et al. | |
| 9,176,072 B2 | 11/2015 | Zhao et al. | |
| 9,182,358 B2 | 11/2015 | Xu et al. | |
| 9,291,575 B2 | 3/2016 | Zhao et al. | |
| 9,404,873 B2 | 8/2016 | Biellak et al. | |
| 9,619,878 B2 | 4/2017 | Stanke et al. | |
| 9,989,477 B2 | 6/2018 | Vaez-Iravani et al. | |
| 10,488,348 B2 | 11/2019 | Romanovsky et al. | |
| 11,204,330 B1 | 12/2021 | Vaez-Iravani et al. | |
| 2004/0156539 A1 | 8/2004 | Jansson et al. | |
| 2007/0103676 A1 | 5/2007 | Marxer et al. | |
| 2009/0059216 A1* | 3/2009 | Shibata | G01N 21/956 356/237.4 |
| 2011/0169944 A1 | 7/2011 | Zhao et al. | |
| 2012/0262709 A1 | 10/2012 | Uto et al. | |
| 2012/0318775 A1 | 12/2012 | Schwarz | |
| 2013/0011043 A1 | 1/2013 | Shimura | |
| 2013/0148114 A1 | 6/2013 | Berlatzky et al. | |
| 2018/0073993 A1* | 3/2018 | Zhao | G01N 21/8806 |
| 2018/0269234 A1 | 9/2018 | Hughes et al. | |
| 2020/0371046 A1* | 11/2020 | Wang | G01N 21/9505 |
| 2021/0072021 A1 | 3/2021 | Hill et al. | |
| 2022/0034823 A1 | 2/2022 | Ono et al. | |
| 2023/0175981 A1 | 6/2023 | Kondo et al. | |
| 2023/0260955 A1 | 8/2023 | Wang et al. | |
| 2023/0274413 A1 | 8/2023 | Lu et al. | |

FOREIGN PATENT DOCUMENTS

| | | |
|---|---|---|
| JP | 2021180202 A | 11/2021 |
| KR | 960014967 B1 | 10/1996 |
| TW | 200416402 A | 9/2004 |
| TW | 200912288 A | 3/2009 |
| TW | 202101604 A | 1/2021 |
| WO | 2018008512 A1 | 1/2018 |

OTHER PUBLICATIONS

International Search Report and Written Opinion dated Nov. 19, 2024 for Application No. PCT/US2024/041389.

Taiwanese Office Action for Application No. 113130466 dated Mar. 12, 2026.

Taiwanese Office Action for Application No. 113129660 dated Apr. 15, 2026.

* cited by examiner

MULTIDIRECTIONAL ILLUMINATION FOR HYBRID BONDING DEFECT DETECTION

CROSS-REFERENCE TO RELATED APPLICATIONS

This application claims priority to U.S. Provisional Application Ser. No. 63/536,366 filed Sep. 1, 2023, which is herein incorporated by reference in its entirety.

FIELD

Embodiments described herein generally relate to a semiconductor device fabrication process, and more particularly, to pre-bonding inspection in a chip-to-substrate hybrid bonding process.

BACKGROUND

Chip-to-substrate (C2S) hybrid bonding is a packaging and chip-stacking technique in which pre-diced chiplets are precisely fused onto a larger substrate. Unlike previous bonding techniques, metallic interconnects (e.g., copper) are embedded both in dielectric layers (e.g., $SiO_x$) of a chiplet and in dielectric layers on a substrate to which the chiplet is bonded. When brought into contact, the dielectric layers of the chiplet and on the substrate weakly bond with one another almost instantly. A subsequent high-temperature annealing step is then required to fuse of the metallic interconnections, as well as strengthening the bond between the dielectric layers.

The presence of point defects such as particles, chips, cracks, or excessive topographical variations on surfaces of the chiplet and/or the substrate, adversely affect bond quality and give rise to post-bonding defects. These post-bonding defects generally manifest as air gaps of various sizes that impede proper interconnect formation, adversely impact yield, and result in costly wastage of fully manufactured chiplets/substrate. This wastage is particularly severe in use cases where a single substrate may host multiple chiplets (either stacked side-by-side on the substrate, or one-atop-another). However, a pre-bonding inspection to identify such small point defects (e.g., hundreds of nanometers) has been a challenge since optical signals from small point defects is buried in large optical signal from features (e.g., metallic interconnects) in certain geometrical patterns formed in the large substrate having a width or diameter of about 300 mm.

Accordingly, there is a need for a pre-bonding inspection system that can effectively detect small pre-bonding point defects while reducing the obscuring effect of signals generated from geometrical patterns formed on a substrate.

SUMMARY

Embodiments of the present disclosure provide an optical inspection system for pre-bonding inspection. The optical inspection system includes a stage having an upper surface on which a sample to be inspected is placed, a sensor, a plurality of optical assemblies, each optical assembly of the plurality of optical assemblies including an optical head having optics to direct a sample field-of-view (FOV) to a portion of a surface of the sample on the stage, a first external light source configured to illuminate the surface of the sample at a first oblique angle to the surface of the sample on the stage, a second external light source configured to illuminate the surface of the sample at a second oblique angle to the surface of the sample on the stage, a focusing lens to focus a first optical image of the portion of the surface of the sample generated by the first external light source, and a second optical image of the portion of the surface of the sample generated by the second external light source onto a segment of the sensor, and a controller configured to combine the first optical image and the second optical image generated by each optical assembly of the plurality of optical assemblies, and generate a map of point defects on the surface of the sample.

Embodiments of the present disclosure also provide a method of pre-bonding inspection. The method includes illuminating a surface of a sample by a first light source at a first oblique angle to the surface of the sample and by a second light source at a second oblique angle to the surface of the sample, the surface of the sample having a two dimensional (2D) periodic pattern and defects, acquiring a first optical image generated by the first light source and a second optical image generated by the second light source, and acquiring an optical image of point defects on the surface of the sample specifying locations of the point defects on the surface of the sample, by combining the first optical image and the second optical image.

Embodiments of the present disclosure further provide a method of chip-to-substrate hybrid bonding. The method includes performing a pre-bonding inspection process on a substrate die having metallic bond pads, and a chiplet having metallic bond pads, including generating dual optical images of a surface of the substrate die by dual-directional illumination, wherein each optical image of the dual optical images are formed using a different directional illumination of the surface of the substrate die, generating a composite optical image of point defects on the surface of the substrate die by combining the dual optical images of the surface of the substrate die, generating dual optical images of a surface of the chiplet by dual-directional illumination, wherein each optical image of the dual optical images are formed using a different directional illumination of the surface of the chiplet, and generating a composite optical image of point defects on the surface of the chiplet by combining the dual optical images of the surface of the chiplet, and inspecting the generated composite optical images, wherein inspecting the generated composite optical images includes at least one of determining a location of at least one of the point defects on the surface of the substrate die based on the composite optical image of the point defects on the surface of the substrate die, and determining a location of at least one of the point defects on the surface of the chiplet based on the composite optical image of the point defects on the surface of the chiplet.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

Figure 1:
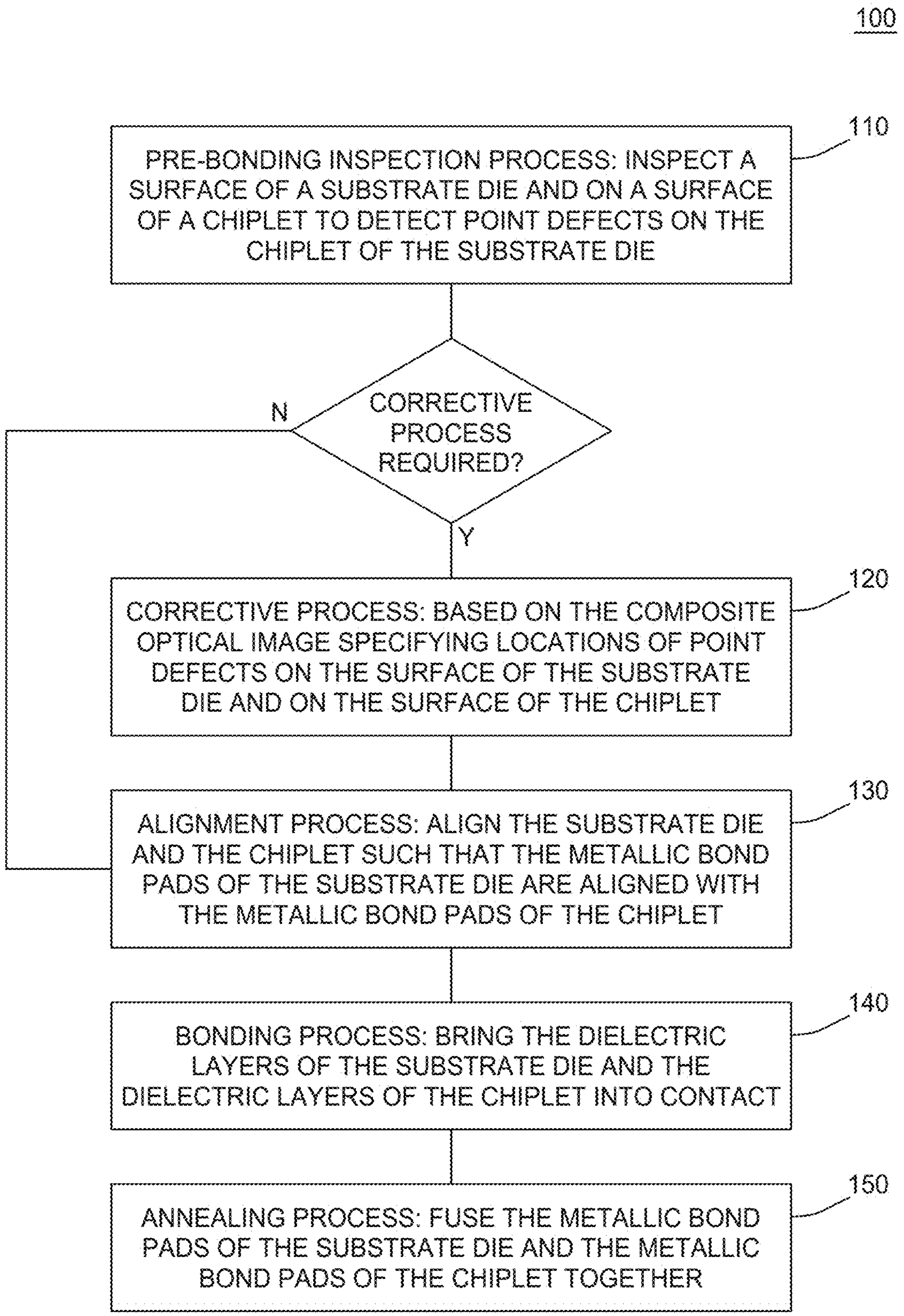
FIG. 1 depicts a process flow diagram of a method of a chip-to-substrate hybrid bonding process, according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

The embodiments described herein provide systems and methods for performing an optical inspection process to detect small point defects on a chiplet and/or a substrate die to which the chiplet is bonded. In the systems described herein, a surface of a sample (e.g., a chiplet, a substrate die, or a substrate die with a chiplet bonded thereto) is illuminated at two or more different oblique angles and optical images generated by illumination at the two or more different oblique angles are combined. In the combined optical image, optical signal from features (such as metallic bond pads) in a geometrical pattern (e.g., a circular pattern) on a substrate die (e.g., 300 mm wafer) is eliminated or reduced, and thus signal from small defects (e.g., hundreds of nanometers) is enhanced relative to the features. A map of the defects on the surface of the sample generated from the combined optical image can be used to identify locations of such small defects and determine corrective actions to perform during a chip-to-substrate hybrid bonding process.

Figure 2A:
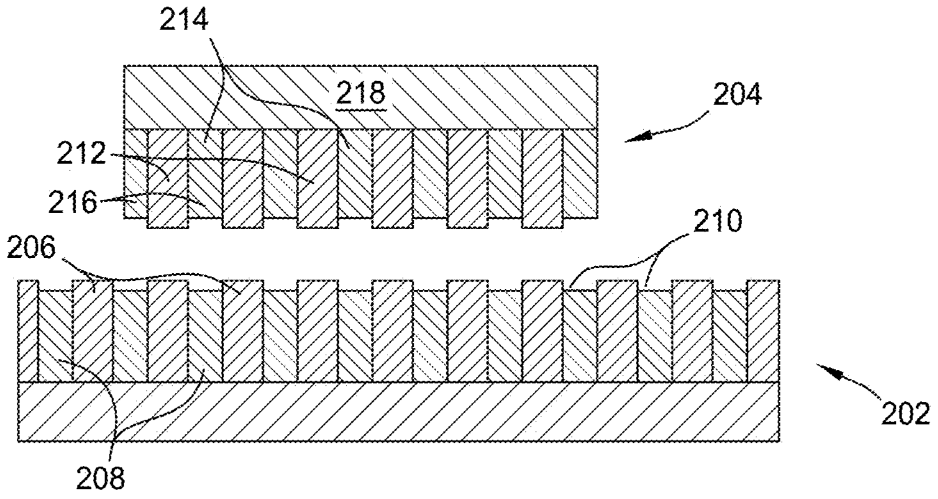
FIGS. 2A, 2B, and 2C are cross-sectional views of a substrate die and a chiplet, corresponding to various states of the method 100 of FIG. 1.
Figure 2B:
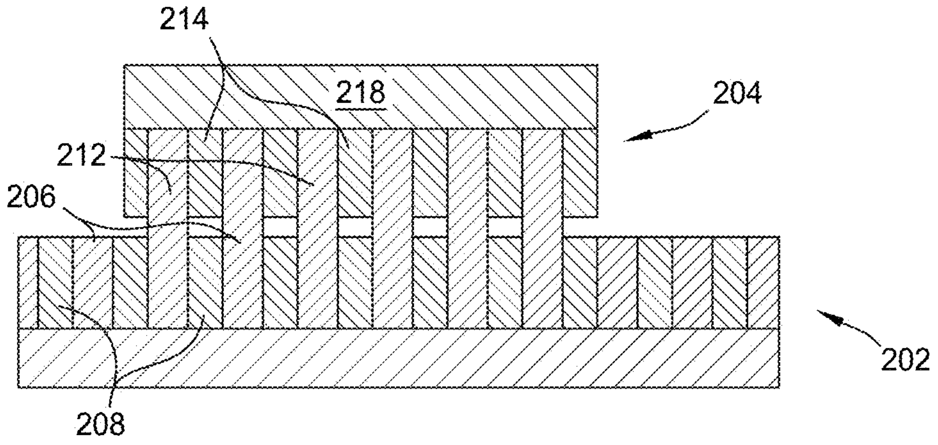
Figure 2C:
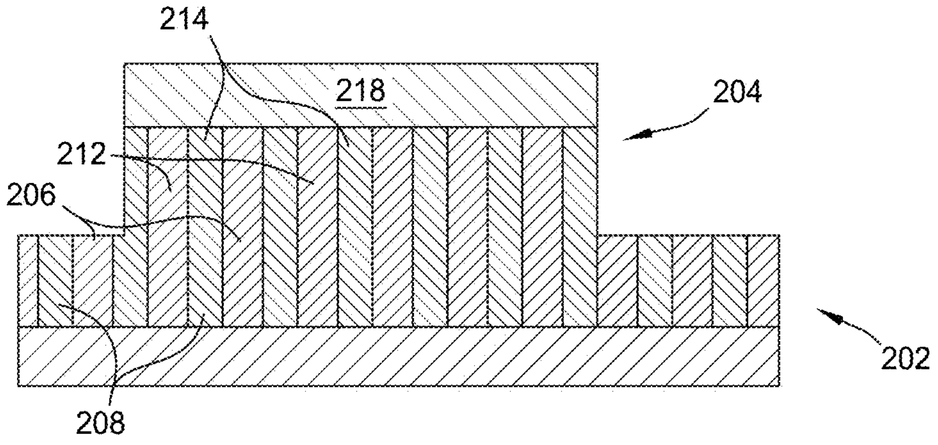

FIG. 1 depicts a process flow diagram of a method 100 of a chip-to-substrate hybrid bonding process, according to one or more embodiments of the present disclosure. FIGS. 2A, 2B, and 2C are cross-sectional views of a substrate die 202 and a chiplet 204 (e.g., a die singulated from another substrate), corresponding to various states of the method 100. In some cases, the substrate die 202 is one portion of a larger substrate 201 that includes a plurality of substrate dies 202 formed therein, wherein the larger substrate 201 can include, for example, a 300 mm, 450 mm, 550 mm, or larger square or round substrate.

As shown in FIG. 2A, the substrate die 202 may include metallic bond pads 208, having features 210, embedded within the dielectric layer 206. The chiplet 204 may include a dielectric layer 212 and metallic bond pads 214, having features 216, embedded within the dielectric layer 212. The dielectric layers 206 and 212 may formed of silicon dioxide ($SiO_2$), for example. In one example, the metallic bond pads 208 and the metallic bond pads 214 may be circular and are substantially formed of copper.

The method 100 begins with block 110, in which a pre-bonding inspection process is performed on a surface of the substrate die 202 and on a surface of the chiplet 204, to detect point defects, such as chips, cracks, scratches, organic residues, or other particles positioned on the chiplet 204, and excessive topological variations on the chiplet 204 or the substrate die 202.

As described in detail below (as the method 600), a pre-bonding inspection includes generating two or more optical images of a surface of a sample (e.g., a surface of the substrate die 202, a surface of the chiplet 204) by use of at least dual-directional illumination (e.g., illumination of the surface of the sample at two different oblique angles to the surface of the sample), and subsequently generating a composite optical image of point defects on the surface of the sample by combining the optical images of the surface of the sample, in which optical signal from features in a two dimensional (2D) periodic pattern, such as the metallic bond pads 208 on the substrate die 202 and the metallic bond pads 214 on the chiplet 204, can be eliminated or reduced. The composite optical image of point defects of the surface of the sample is then reconstructed to generate a map of point defects on the surface of the sample, specifying locations of the point defects on the surface of the sample. The generated map will include information relating to the relative position of the defects found on or within the sample based on pixel coordinate data generated by the optical sensor based on the received optical signal. In some embodiments, the system controller generates a 2D map of the defects found on or within a sample. The generated 2D map will contain the position information (e.g., X-Y position information) for the various defects, which can then be used to perform a corrective process. In some embodiments, the optical sensor is a digital image sensor, such as a charge-coupled device (CCD) or an active-pixel sensor (CMOS sensor).

In block 120, a corrective process is performed based on the composite optical image specifying locations of point defects on the surface of the substrate die 202 and on the surface of the chiplet 204. The corrective process may include adding or modifying a pre-cleaning process on the surface of the substrate die 202 and/or the surface of the chiplet 204 to remove particles prior to a boding process, reducing bonding pressures for scratched chiplets in a bonding process to reduce chiplet cracking, depositing additional gapfill material on the surface of the substrate die 202 and/or the surface of the chiplet 204 after a bonding process to ensure coverage of varying chiplet heights, or halting the chip-to-substrate hybrid bonding process, and removing the chiplet 204 for further steps of the chip-to-substrate hybrid bonding process. The corrective process may further include a feed backwards into potentially defective processes outside of a bonder (e.g. CMP, dicing) as a function of wafer location, or time, creating metrics for initial setup, tool qualification and tool-to-tool matching, prompting tool maintenance and re-qualification as a function of increased defectivity over time.

In block 130, an alignment process is performed to align the substrate die 202 and the chiplet 204 such that the metallic bond pads 208 of the substrate die 202 are aligned with the metallic bond pads 214 of the chiplet 204.

In block 140, a bonding process is performed to bring the surface of the substrate die 202 and the surface of the chiplet 204 into contact. When brought into contact, the dielectric layer 206 of the substrate die 202 and the dielectric layer 212 of the chiplet 204 weakly bond to one another.

In block 150, an annealing process is performed to fuse the metallic bond pads 208 of the substrate die 202 and the metallic bond pads 214 of the chiplet 204 together. A high temperature anneal step fuses the metallic bond pads 208 and the metallic bond pads 214, as well as strengthen the bonding of the dielectric layer 206 of the substrate die 202 and the dielectric layer 212 of the chiplet 204. Electrical circuits (not shown) on the bottom of the substrate die 202 are then connected to electrical circuits 218 formed in the chiplet 204.

During the chip-to-substrate hybrid bonding process, the presence of point defects on the chiplet 204 or the substrate die 102, affect fidelity of the chip-to-substrate hybrid bonding and give rise to post-bonding defects. The post-bonding defects generally manifest as air gaps that impede proper interconnect formation or form broken circuits, which will adversely impact device yield, and result in the costly need to scrap the fully manufactured chiplet/substrate dies. The created waste is particularly severe in use cases where a single substrate die 202 may host multiple chiplets (either stacked side-by-side on the substrate, or one-atop-another).

The embodiments described herein provide an optical inspection system that can effectively detect point defects while eliminating or reducing the effect of the optical signal received from background (e.g., optical signals from the substrate having features in a periodic pattern formed thereon), such that the point defects can be addressed and/or resolved during a chip-to-substrate hybrid bonding process.

FIGS. 3A, 3B, 3C, and 3D depicts types of samples in which defects and particles formed thereon can be detected by an optical inspection system according to the embodiments described herein.

Figure 3A:
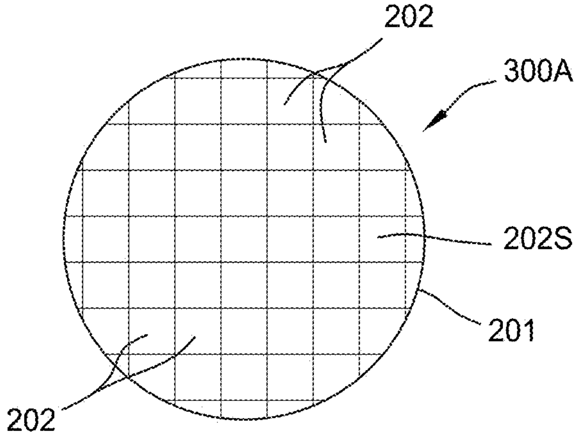
FIGS. 3A, 3B, 3C, 3D, and 3E depict types of samples in which defects and particles formed thereon can be detected by an optical inspection system according to the embodiments described herein.

FIG. 3A depicts a first type sample 300A to be inspected, which includes a substrate 201 that includes a plurality of substrate die 202 to which chiplets 204 can be bonded.

Figure 3B:
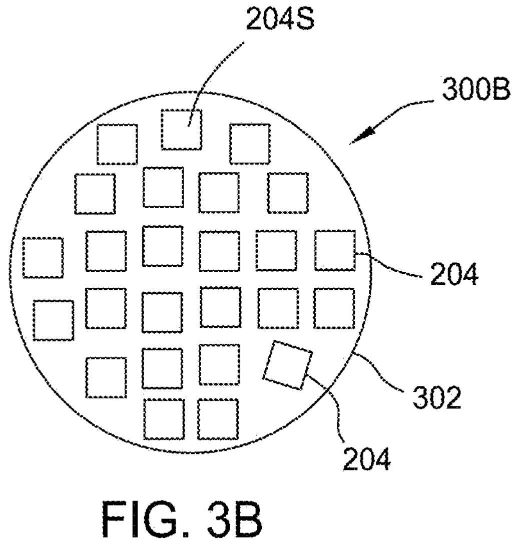

FIG. 3B depicts a second type sample 300B to be inspected, which includes singulated and unbonded chiplets 204 on a carrier 302. The carrier 302 may be a tape frame. The chiplets 204 have been diced or sawed, and mounted to the carrier 302, to be transferred to the substrate die 202 during a bonding process. Although the carrier 302 sufficiently holds the chiplet 204 during a singulation process, the chiplets 204 are not always positioned in an aligned manner due to the singulation process which destroys the lithography-defined alignment, and further due to the flexibility of the carrier 302. Thus, some of the chiplets 204 may be skewed relative to each other. In one example, the chiplets 204 are misaligned relative to each other in a plane that is parallel to the top surface 204S of the chiplets 204. However, in some cases the top surfaces 204S of the chiplets 204 are misaligned relative to each other, wherein the misalignment can include a spacing in the X, Y and Z directions misalignment and also an angular misaligned such as a pitch, yaw and roll angular orientation misalignment. For example, as the carrier 302 flexes, top surfaces 204S of the chiplets 204 vary in height relative to each other.

Figure 3C:
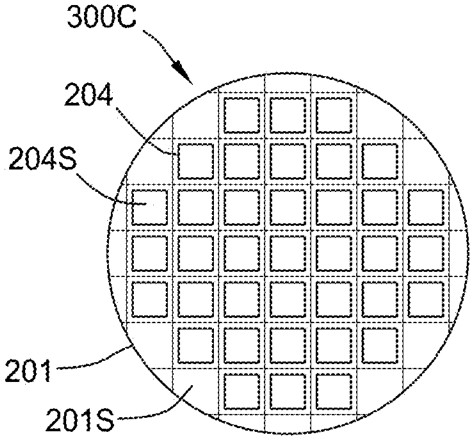
Figure 3D:
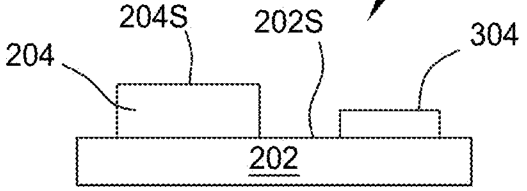

FIG. 3C depicts a third type sample 300C to be inspected, which includes singulated chiplets 204 bonded to a top surface 202S of the substrate die 202. FIG. 3D depicts a fourth type sample 300D to be inspected, which includes a substrate die 202 having a singulated chiplet 204 bonded thereon, and a chiplet 304 having a different height from the chiplet 204 to be bonded to the substrate die 202. In some cases, as shown in FIG. 3D, the top surfaces 204S of the singulated chiplets 204 and the top surface 202S of the substrate die 202 present a substantial height difference that must be overcome when optically scanning top surfaces of the third type sample 300C.

Figure 3E:
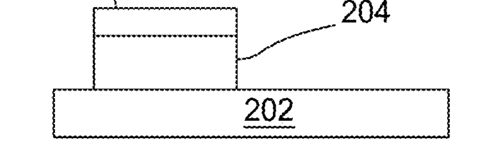

FIG. 3E depicts a fifth type sample 300E to be inspected, which includes a singulated chiplet 204 bonded to the substrate die 202 and another singulated chiplet 306 bonded to the singulated chiplet 204.

Figure 4:
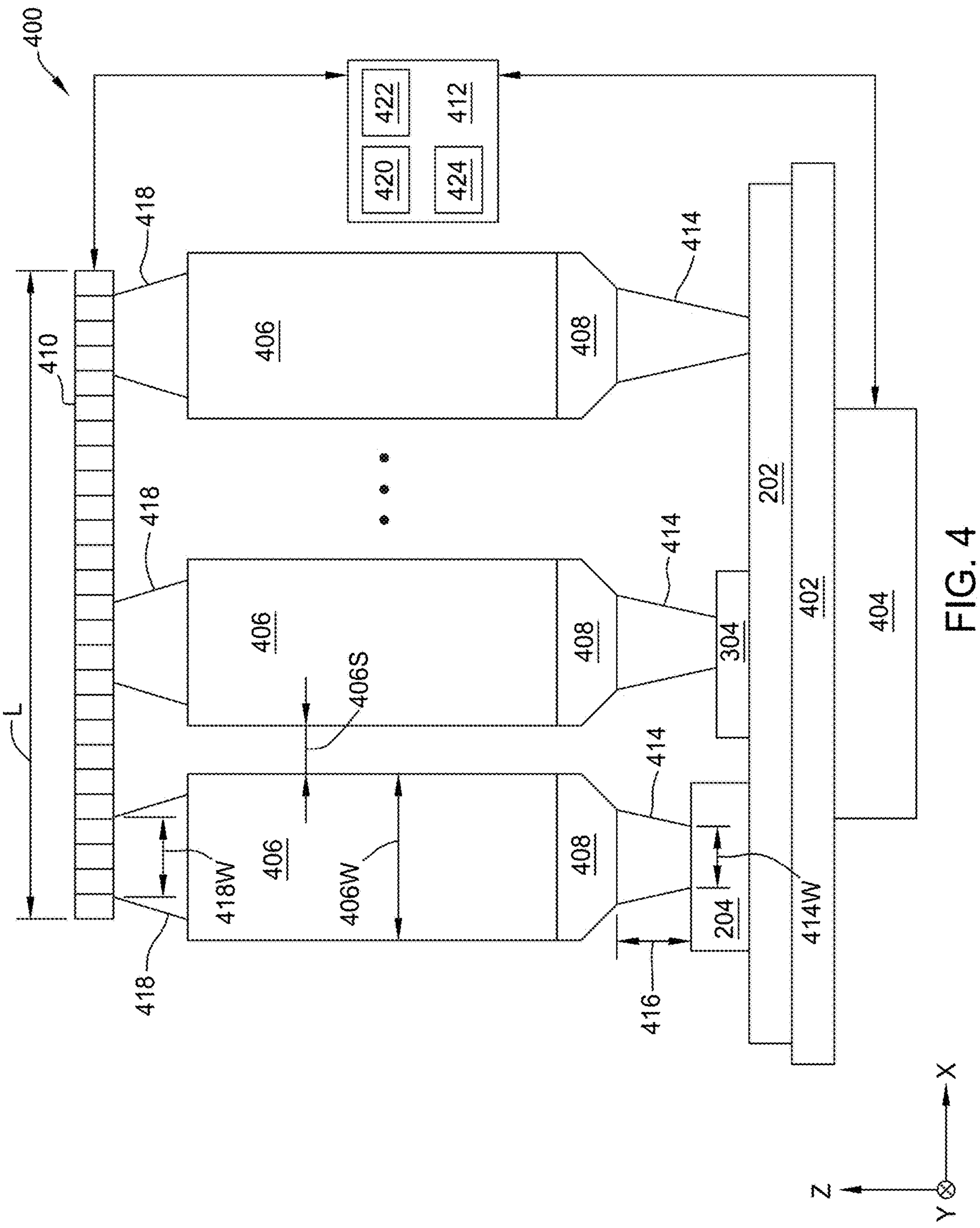
FIG. 4 is a schematic view of an optical inspection system, according to one or more embodiments of the present disclosure.

FIG. 4 is a schematic view of an optical inspection system 400, according to one or more embodiments of the present disclosure. The optical inspection system 400 includes a stage 402 having an upper surface (in the XY plane) on which a sample 300 to be inspected is placed, a motion assembly 404, a plurality of optical assemblies 406 each having an optical head 408, a time delay integration (TDI) linear sensor 410, and a controller 412. A TDI linear sensor 410 is generally a method of using a charge-coupled device (CCD) as an image sensor for capturing images of an object that is moved relative to the sensor. The process utilizes the time-delay integration of the accumulation of cumulative exposures of the same object as it is moving linearly relative to the detector. A sample 300 may include a substrate die 202 and chiplets 204 and 304 bonded on a surface of the substrate die 202.

The motion assembly 404 can move the stage 402 in multiple axes to allow complete scanning of a surface of the sample 300. In some embodiments, the stage 402 is a 4-axis stage (i.e., X, Y, Z, Theta motion). Each optical head 408 can also optionally contain an independent Z-positioner (e.g., motor-based, or piezo, not shown in FIG. 4).

Each optical assembly 406 includes an illumination system (e.g., one or more light sources internal or external to the optical assembly 406). In some embodiments, the optical assembly 406 also includes a Z-positioner (e.g., based on a motor, piezo, liquid lens, or motorized lens unit) to compensate for different height ranges on the surface of the sample 300. The optical assembly 406 has a sample field-of-view (FOV) 414 that is focused on a portion of the surface of the sample 300 having a sample FOV width 414W of between about 1 mm and about 5 mm in some embodiments. A distance 416 between the optical head 408 and the surface of the sample 300 in the Z-direction (orthogonal to the surface of the sample 300 and the upper surface of the stage 402) can be adjusted by the motion assembly 404 as needed (e.g., to maintain the distance 416 within a focusing range of the optical assembly 406, to clear maximum height on the surface of the sample 300). The optical assembly 406 may have a width 406W of about 30 mm and about 80 mm. A spacing 406S between the adjacent optical assemblies 406 may be between about 1 mm and about 20 mm.

The optical assembly 406 transmits an image of a portion, having the sample FOV width 414W, of the surface of the sample 300 through the optical assembly 406 and onto a segment of the TDI linear sensor 410 via a focused TDI FOV 418. In some embodiments, the focused TDI FOV 418 is focused at a segment of the TDI linear sensor 410 having a TDI FOV width 418W of between about 5 mm and about 30 mm depending on the magnification capabilities of the optical assembly 406. The surface of the sample 300 may have varying Z-heights (e.g., a chiplet 204, a shorter chiplet 304, no chiplets) and require different focus planes or adjustments of the stage 402 along the Z-axis. In some embodiments, each optical head 408 maps to a different location along the X-axis and a different location on the surface of the sample 300 with each optical assembly 406 independently focused on the surface of the sample 300 underneath.

The TDI linear sensor 410 may have a length L along the X-axis of between about 10 mm and about 160 mm. The number of pixels along the length L of the TDI linear sensor 410 that are used to receive an optical image of the surface of the sample 300 corresponds to an available number of portions of the surface of the sample 300, each having the sample FOV width 414W. A sample 300 on the stage 402 is moved by the motion assembly 404 back and forth in the X-direction along the length L of the TDI linear sensor 410 and imaged N times accumulatively by the TDI linear sensor 410 (e.g., time delay integration (TDI) scanning), increasing the number of photons collected for a given sample and improving signal-to-noise (SNR) without requiring hesitation over the sample 300 (continuous imaging).

The controller 412 is in communication with the motion assembly 404 and can cause the motion assembly 404 to move the stage 402, for example, back and forth in the X-direction to continuously scan the surface of the sample 300, and in the Z-direction to maintain the distance 416 between the optical head 408 and the surface of the sample 300 within a focusing range of the optical assembly 406. The controller 412 can also communicate with the optical assemblies 406 to facilitate in adjusting illumination, focus, and other optical assembly parameters. The controller 412 may also receive and store raw images from the TDI linear sensor 410 and process the stored raw images (e.g., combine the stored raw images) and/or provide control the TDI linear sensor 410 as needed. The controller 412 may directly control the optical inspection system 400, or alternatively control other controllers (e.g., computers) associated with the optical inspection system 400. In operation, the controller 412 enables data collection and feedback from the optical inspection system 400 to optimize performance of the optical inspection system 400 and to control the process flows according to the methods described herein.

The controller 412 generally includes a central processing unit (CPU) 420, a memory 422, and a support circuit 424. The CPU 420 may be any form of a general-purpose computer processor that can be used in an industrial setting. The support circuit 424 is coupled to the CPU 420 and may comprise a cache, clock circuits, input/output subsystems, power supplies, and the like. Software routines, such as the process flows according to the methods as described herein may be stored in the memory 422 and, when executed by the CPU 420, transform the CPU 420 into a specific purpose computer as the controller 412. The software routines may also be stored and/or executed by a second controller (not shown) that is located remotely from the optical inspection system 400.

Figure 5A:
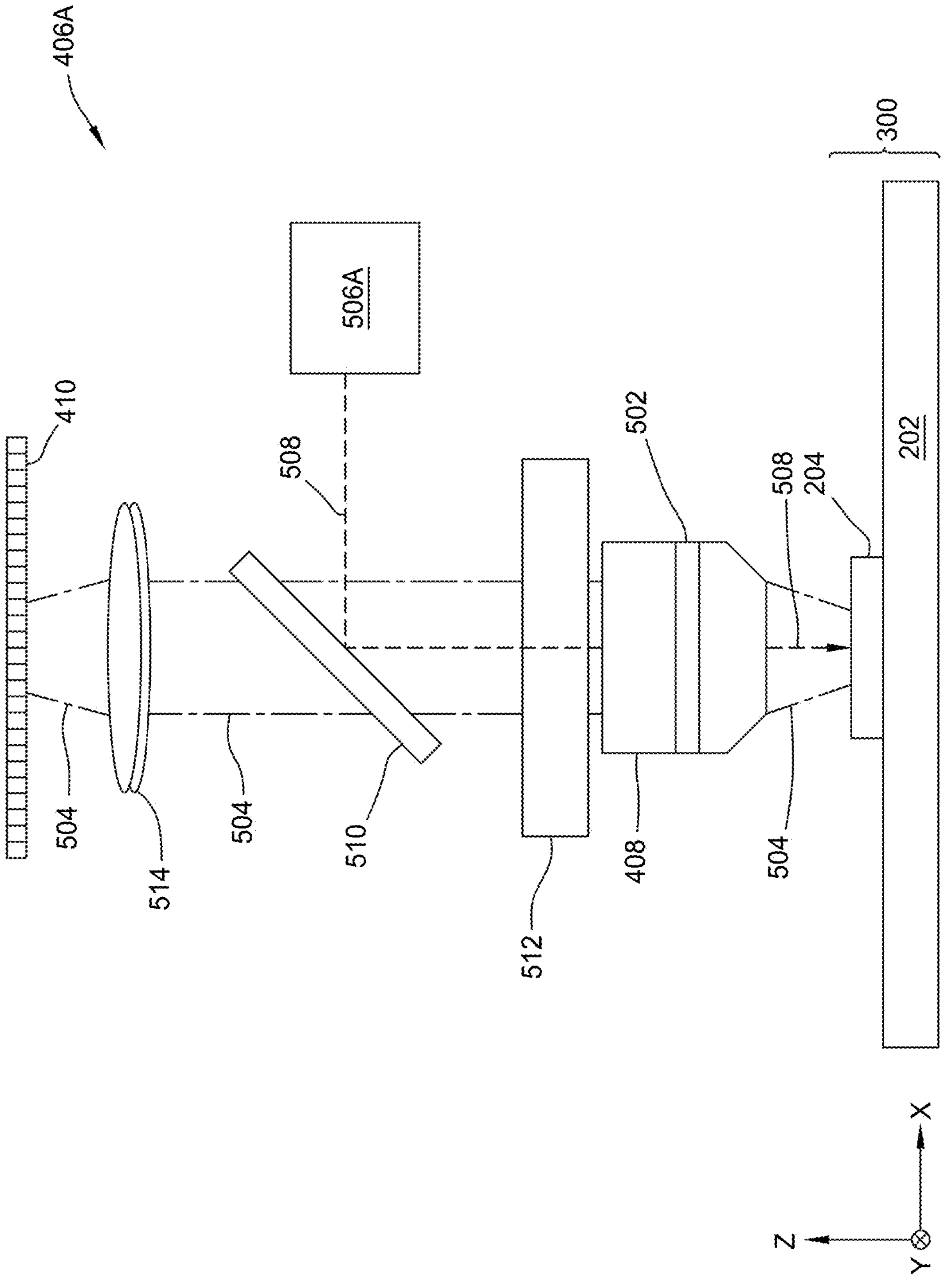
FIGS. 5A and 5B are schematic views of exemplary embodiments of an optical assembly.
Figure 5B:
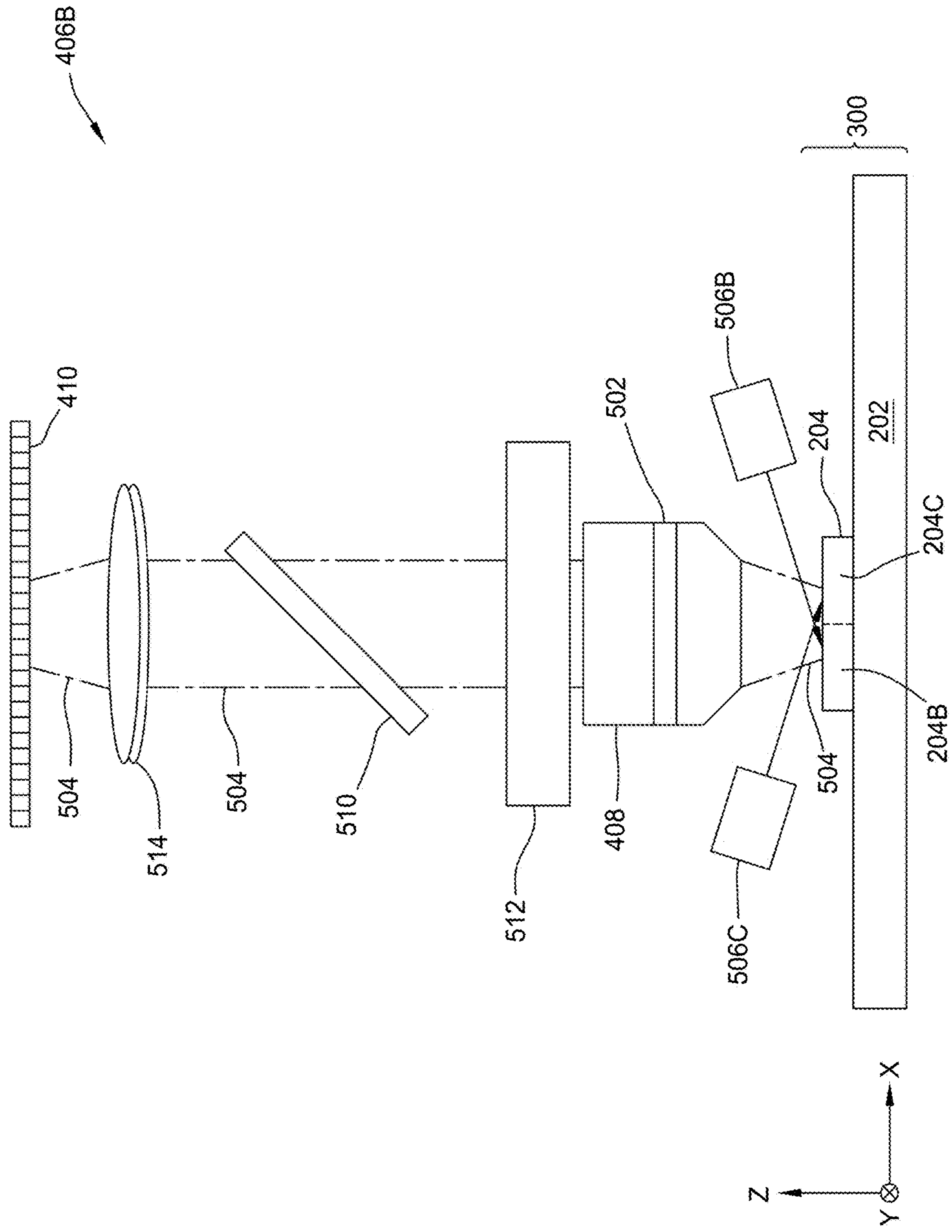

FIGS. 5A and 5B are schematic views of exemplary embodiments of the optical assembly 406. The optical assembly 406A shown in FIG. 5A has an epi-illumination (e.g., top-down illumination) capability. The optical assembly 406B shown in FIG. 5B has a dark-field illumination (e.g., oblique illumination) capability.

The optical head 408 has optics 502 that aid in directing the sample FOV 414 to a portion, having the sample FOV width 414W, of the surface of the sample 300 to obtain an optical image 504 on a segment of the TDI linear sensor 410.

The optical assembly 406A shown in FIG. 5A includes an internal light source 506A that produces an illumination beam 508 reflected by a splitter 510 and impinged on the surface of the sample 300. The internal light source 506A may be a laser, light emitting diode (LED), lamp, or alternative incoherent light source.

The optical assembly 406B shown in FIG. 5B includes a first external light source 506B and a second external light source 506C, which sit outside of a collection aperture of the optical head 408. The surface of the sample 300 is illuminated at two different oblique angles to the surface of the sample 300 by the first external light source 506B and the second external light source 506C. Dark-field illumination is particularly sensitive to defects on edges of chiplets, and particles on surfaces and edges of a surface of a sample. Dark-field illumination is also sensitive to large un-wanted height variations at edges of the chiplets which can cause significant artifacts near the edges of the sample. The first external light source 506B is used to illuminate one side 204B of the chiplet 204 and the second external light source 506C is used to illuminate another side 204C of the chiplet 204. The first external light source 506B and the second external light source 506C may be each a uni-directional or nearly uni-directional laser or LED.

A Z-positioner 512 is used to make high-speed changes to allow for focus of the sample FOV 414 on the surface of the sample 300 as the sample 300 moves under the optical inspection system 400. In some embodiments, the Z-positioner 512 may use a motor to move the assembly, may use an electrically tunable lens assembly or piezo. The optical image 504 traverses through the optical assembly 406 to a focusing lens 514 that focuses the optical image 504 onto a segment of the TDI linear sensor 410.

Figure 6:
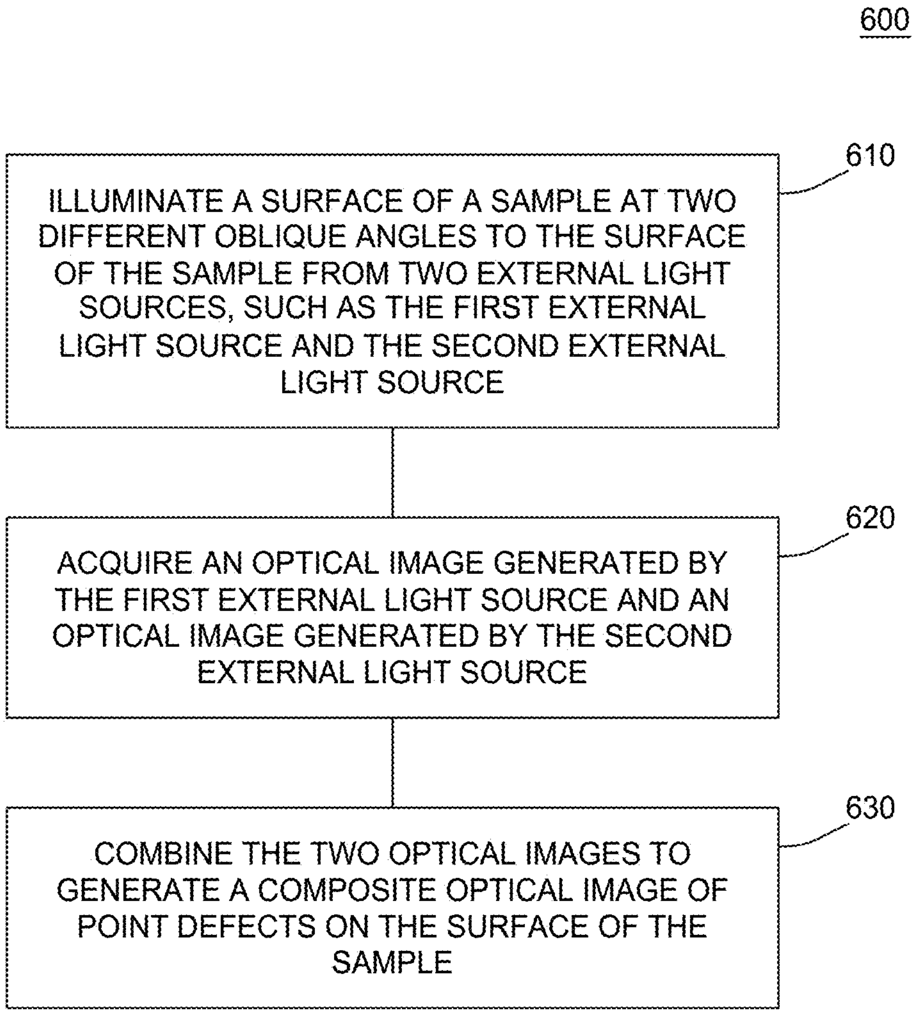
FIG. 6 depicts a process flow diagram of a method of pre-bonding inspection, according to one or more embodiments of the present disclosure.

FIG. 6 depicts a process flow diagram of a method 600 of pre-bonding inspection, using an optical inspection system having multi-directional illumination capability, such as the optical inspection system 400 (shown in FIG. 4) having optical assemblies 406B (shown in FIG. 5B), according to the embodiments described herein. In the example described herein, a sample 300 that undergoes pre-bonding inspection includes a substrate die 202 with circular metallic bond pads 208 (shown in FIG. 2A) formed thereon. In addition, a surface of the sample 300 may include chiplets 204, 304, 306 formed on the substrate die 202 (shown in FIGS. 3A-3E). The surface of the sample 300 may include point defects (having no geometrical patterns), such as chips, cracks, scratches, organic residues, or other particles along sides of the chiplets 204, height variations of the chiplets 204, 304, 306 or excessive topographical variations on the chiplets 204 or the substrate die 202. It should be noted that this particular embodiment is a possible two dimensional (2D) periodic pattern formed on a substrate die 202 that can be used to eliminate or reduce optical signal therefrom, according to the present disclosure. The present disclosure it not intended to be limited to the particular 2D periodic pattern used to describe aspects of one or more of the embodiments disclosed herein.

Figure 7A:
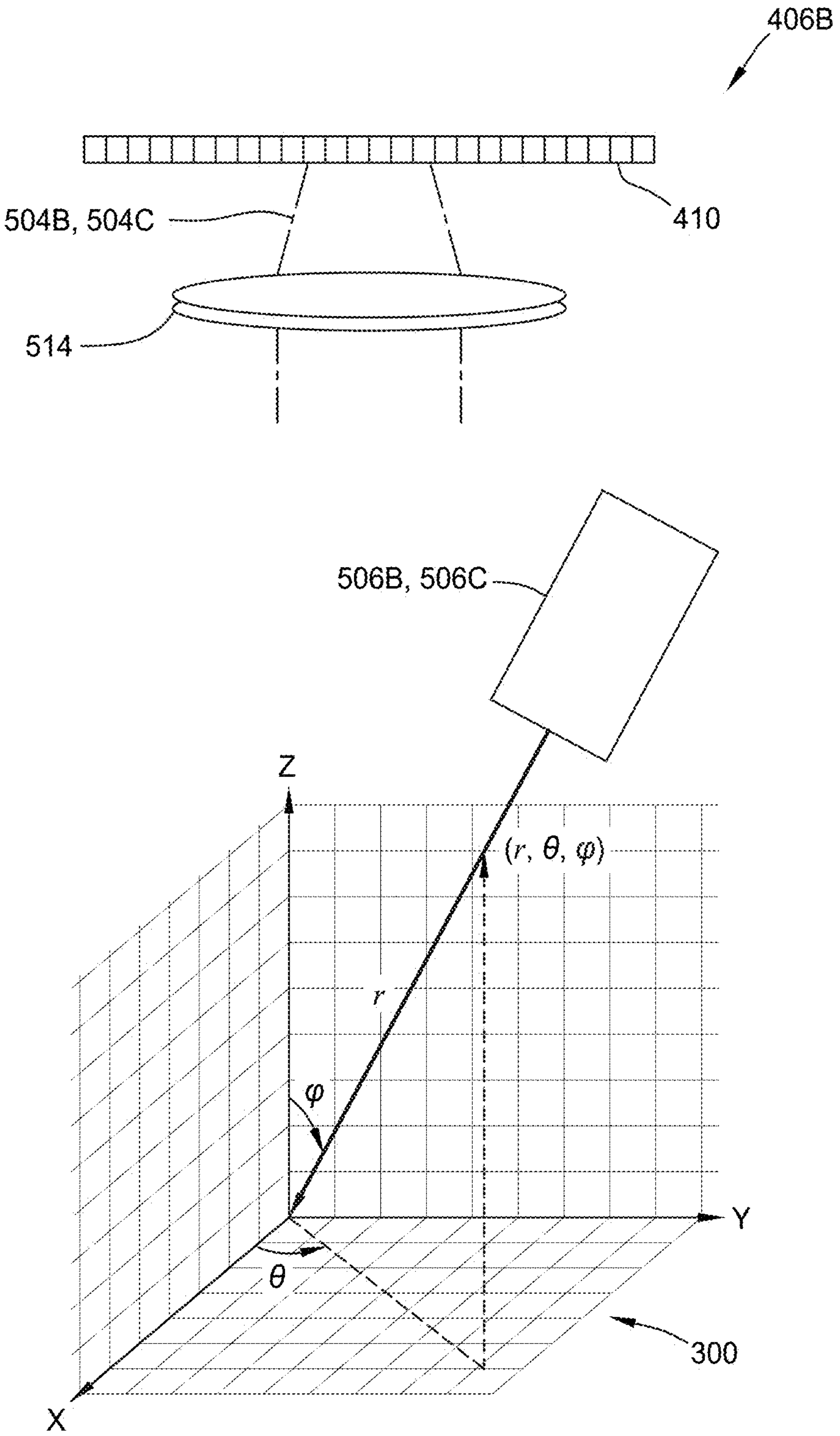
FIG. 7A depicts an oblique angle of illumination from an external light source.

In block 610, a surface of a sample 300 is illuminated at two different oblique angles to the surface of the sample 300 from two external light sources, such as the first external light source 506B and the second external light source 506C, as shown in FIG. 5B. FIG. 7A illustrates the general angular relationships that each of the light sources will have with the sample 300. In one embodiment, the oblique angle of illumination for two external light sources can be described along an azimuthal $\theta$ angle and a polar $\varphi$ angle. For example, the two oblique angles are $\theta=45°$, $\varphi=70°$ for the first external light source 506B and $\theta=-45°$, $\varphi=70°$ for the second external light source 506C. In this example, the two oblique angles are orthogonal to each other in the XY plane, which is parallel to the surface of the sample 300 and the upper surface of the stage 402. In other embodiments, two oblique angles that are not orthogonal to each other in the XY plane are used.

In block 620, an optical image 504B generated by the first external light source 506B and an optical image 504C generated by the second external light source 506C in the TDI linear sensor 410 are acquired and stored by the controller 412. In some embodiments, a time delay integration (TDI) scanning of the surface of the sample 300 is used to generate the optical image 504B and the optical image 504C.

Figure 7C:
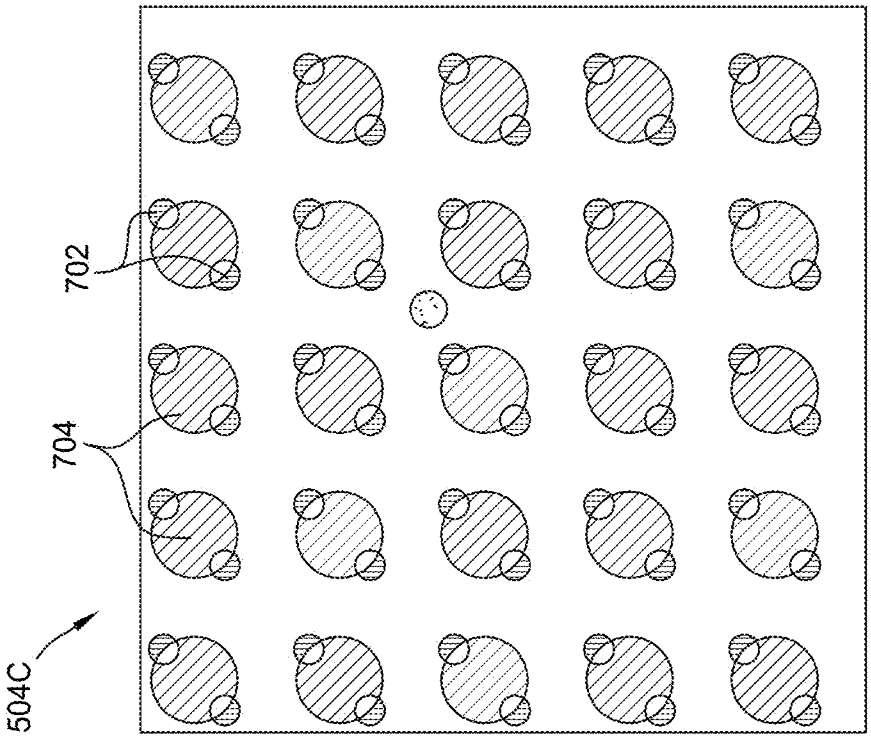
FIGS. 7B, 7C, 7D, and 7E depicts example optical images of a surface of a sample.
Figure 7B:
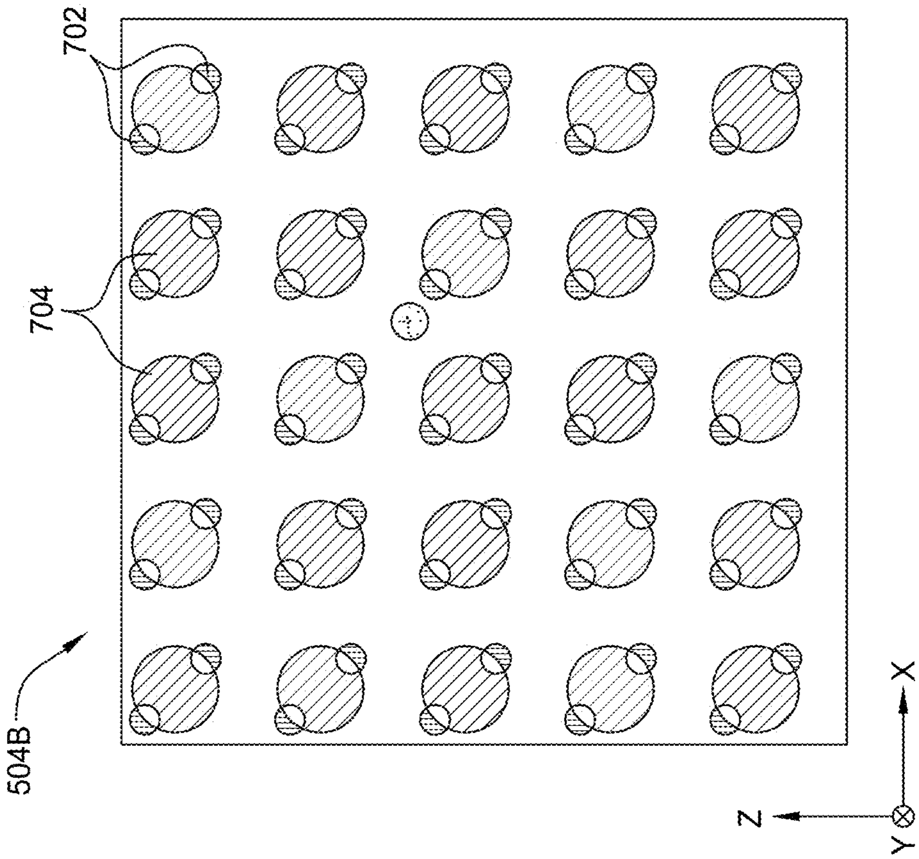

In an example of a sample 300 having a substrate die 202 with an array of circular metallic bond pads 208 formed thereon, which can be represented by a two dimensional (2D) periodic pattern f(x, y) with each bond pad 208 having a circular symmetry, an optical image through a lens (e.g., the splitter 510) corresponds to an electric field distribution at a back focal plane of the lens formed on the TDI linear sensor 410. The electric field distribution is proportional to the Fourier transform $F(u_x, u_y)$ of the initial 2D periodic pattern f(x, y) of the bond pads 208. The lens itself can capture a portion of that electric field distribution to a degree related to numerical aperture (NA) and wavelength of the light reaching the lens. By illuminating this pattern f(x, y) with light (e.g., a plane- or quasi-plane wave) at an oblique angle to the surface of the sample 300, the electric field distribution at the back focal plane of the lens will be shifted from $F(u_x, u_y)$ to $F(u_x-M(\theta, \varphi), u_y-M(\theta, \varphi))$, where $M(\theta, \varphi)$ is a function that depends on the azimuthal θ and polar φ angles. When this technique is applied to an array of circular bond pads disposed in a 2D periodic pattern f(x, y) with a circular symmetry (e.g., the periodic array of bond pads 208), an optical image includes a brightness distribution akin to a dipole 702 that are formed at the edges of each individual metallic bond pad 208, as shown in FIGS. 7B and 7C. The orientation of the dipole 702 is related to the oblique angle (e.g., azimuthal θ angle) of illumination. In the optical image 504B and the optical image 504C in FIGS. 7B and 7C, the array of circular metallic bond pads 208 that would be seen by an epi-illumination are shown by large circles 704 for reference to the position of the bond pads 208. It should be noted that an optical image of point defects on the surface of the sample 300 is not dependent on the oblique angle of illumination.

Figure 7E:
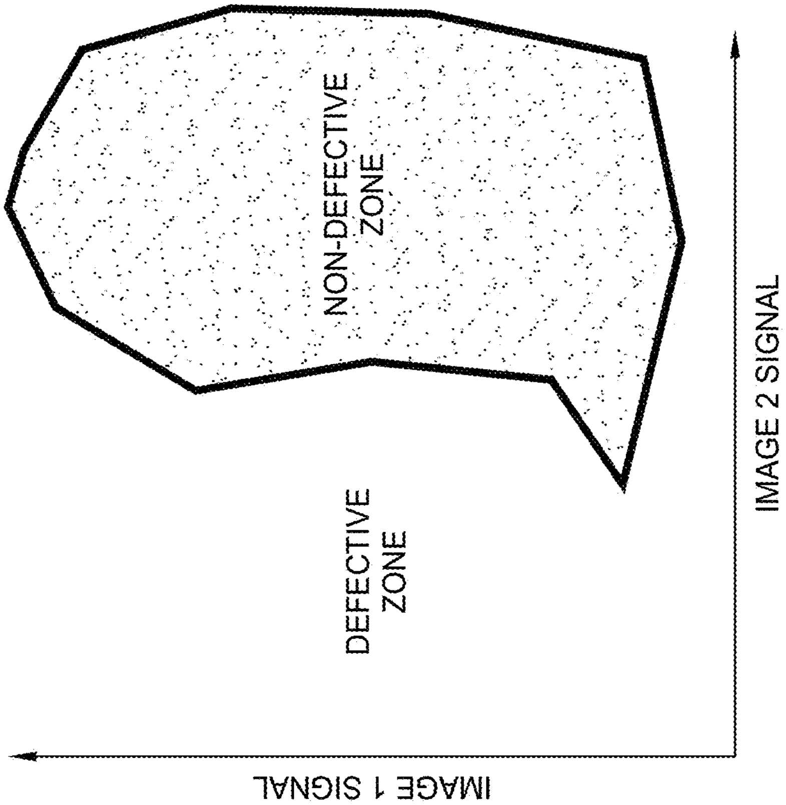
Figure 7D:
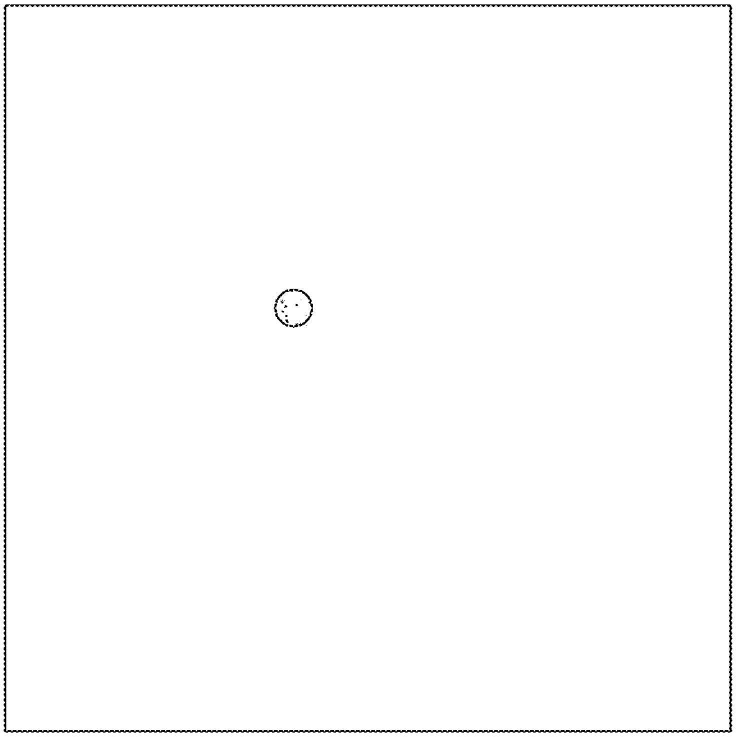

In block 630, the optical image 504B and the optical image 504C are combined, by the controller 412, to generate a composite optical image of point defects on the surface of the sample, specifying location of the detected point defects on the surface of the sample 300. By combining these two separate optical images 504B and 504C that were taken with different directions of illumination (for example, taking the minimum value at each pixel in the optical images 504B and 504C, or taking the product of optical images 504B and 504C), by the controller 412, the optical signal generated by the periodic pattern f(x, y) (e.g., the array of circular metallic bond pads 208) can be reduced, while maintaining the optical signal generated by point defects (FIG. 7D). Alternative filtering techniques can be—for example—thresholding on any linear super-position of the per-pixel signal for 504B/504C. One could also create a 2D vectorial representation for each pixel consisting of the intensity of each image, wherein a certain area within this 2D phase space represents "defectivity" or "normality" for specific types of patterns (FIG. 7E).

As noted above, the composite optical image generated at block 630 can then be used to generate a map of the point defects found on the surface of the sample, which specifies the locations of one or more point defects found on the surface of the sample. The generated map will include information relating to the relative position of the defects found on or within the sample based on pixel coordinate data found within the optical images generated by the optical sensor. The generated maps can then be used to take a corrective action relating to the sample as discussed above.

The embodiments described herein provide systems and methods for pre-bonding inspection to identify point defects on a surface of a chiplet and/or a surface of a substrate die to which the chiplet is to be bonded. In the systems described herein, a surface of a sample (e.g., a chiplet, a substrate die, or a substrate die with a chiplet bonded thereto) is illuminated at two or more different oblique angles and optical images generated by illumination at different oblique angles are combined. In the combined optical image, optical signal from features (such as metallic bond pads) in a geometrical pattern (e.g., a circular pattern) on a substrate die (e.g., 300 mm wafer) is eliminated or reduced, and thus signal from small defects (e.g., hundreds of nanometers) is enhanced. A map of small defects on the surface of the sample generated from the combined optical image can be used to identify locations of such small defects and determine corrective actions to perform during a chip-to-substrate hybrid bonding process.

While the foregoing is directed to embodiments of the present disclosure, other and further embodiments of the disclosure may be devised without departing from the basic scope thereof, and the scope thereof is determined by the claims that follow.

The invention claimed is:

1. An optical inspection system for pre-bonding inspection, comprising:

- a stage having an upper surface on which a sample to be inspected is placed;
- a sensor;
- a plurality of optical assemblies, each optical assembly of the plurality of optical assemblies comprising:
  - an optical head having optics to direct a sample field-of-view (FOV) to a portion of a surface of the sample on the stage;
  - a first external light source configured to illuminate the surface of the sample at a first oblique angle to the surface of the sample on the stage;
  - a second external light source configured to illuminate the surface of the sample at a second oblique angle to the surface of the sample on the stage; and
  - a focusing lens to focus a first optical image of the portion of the surface of the sample generated by the first external light source, and a second optical image of the portion of the surface of the sample generated by the second external light source onto a segment of the sensor; and
- a controller configured to:
  - combine the first optical image and the second optical image generated by each optical assembly of the plurality of optical assemblies; and
  - generate a map of point defects on the surface of the sample.

2. The optical inspection system of claim 1, wherein the first oblique angle and the second oblique angle are orthogonal to each other in a plane parallel to the upper surface of the stage.

3. The optical inspection system of claim 1, wherein

- the sensor comprises a time delay integration (TDI) sensor, and
- a the controller is configured to cause a motion assembly to move the stage in a direction along the length of the TDI sensor when scanning the surface of the sample.

4. The optical inspection system of claim 3, wherein the controller is configured to cause the motion assembly to move the stage in a direction orthogonal to the upper surface of the stage to adjust a distance between the optical head and the surface of the sample.

5. The optical inspection system of claim 1, wherein the sensor comprises a time delay integration (TDI) linear sensor, and the TDI linear sensor has a length of between 10 mm and 160 mm.

6. The optical inspection system of claim 1, wherein the first external light source and the second external light source each comprise a uni-directional or nearly uni-directional laser or light emitting diode (LED).

7. A method of pre-bonding inspection, comprising:

illuminating a surface of a sample by a first light source at a first oblique angle to the surface of the sample and by a second light source at a second oblique angle to the surface of the sample, the surface of the sample having a two dimensional (2D) periodic pattern and defects, wherein the first oblique angle and the second oblique angle have azimuthal directions that are orthogonal to each other in a plane parallel to the surface of the sample;

acquiring a first optical image, of the surface of the sample, generated by the first light source and a second optical image, of the surface of the sample, generated by the second light source; and combining the first optical image and the second optical image, wherein a combined optical image generated from the first optical image and the second optical image specifies locations of the point defects on the surface of the sample.

8. The method of claim 7, wherein the sample comprises metallic bond pads in a two dimensional (2D) periodic pattern formed on the surface of the sample.

9. The method of claim 8, wherein the 2D periodic pattern has a circular symmetry.

10. The method of claim 7, wherein the first light source and the second light source each comprise a uni-directional or nearly uni-directional laser or light emitting diode (LED).

11. The method of claim 7, wherein the acquiring the first optical image and the second optical image comprises a time delay integration (TDI) scanning of the surface of the sample.

12. A method of chip-to-substrate hybrid bonding, comprising:

performing a pre-bonding inspection process on a substrate die having metallic bond pads, and a chiplet having metallic bond pads, comprising:

generating dual optical images of a surface of the substrate die by dual-directional illumination, wherein each optical image of the dual optical images are formed using a different directional illumination of the surface of the substrate die;

generating a composite optical image of point defects on the surface of the substrate die by combining the dual optical images of the surface of the substrate die;

generating dual optical images of a surface of the chiplet by dual-directional illumination, wherein each optical image of the dual optical images are formed using a different directional illumination of the surface of the chiplet; and generating a composite optical image of point defects on the surface of the chiplet by combining the dual optical images of the surface of the chiplet; and inspecting the generated composite optical images, wherein inspecting the generated composite optical images comprises at least one of:

determining a location of at least one of the point defects on the surface of the substrate die based on the composite optical image of the point defects on the surface of the substrate die; and determining a location of at least one of the point defects on the surface of the chiplet based on the composite optical image of the point defects on the surface of the chiplet.

13. The method of claim 12, further comprising:

performing a corrective process based on the generated composite optical image of the point defects on the surface of the chiplet or the generated composite optical image of the point defects on the surface of the substrate die.

14. The method of claim 13, further comprising:

performing an alignment process, to align the metallic bond pads of the substrate die and the metallic bond pads of the chiplet; and performing a bonding process, to bring the surface of the substrate die and the surface of the chiplet into contact.

15. The method of claim 14, further comprising:

performing a corrective process based on the generated composite optical image of the point defects on the surface of the chiplet and the generated composite optical image of the point defects on the surface of the substrate die, the corrective process comprising:

adding or modifying a pre-cleaning process on the surface of the substrate die and/or the surface of the chiplet to remove particles prior to the bonding process;

reducing bonding pressures in the bonding process to reduce chiplet cracking;

depositing additional gapfill material on the surface of the substrate die and/or the surface of the chiplet subsequent to the bonding process; or halting a chip-to-substrate hybrid bonding process; and performing an annealing process, to fuse the metallic bond pads of the substrate die and the metallic bond pads of the chiplet together.

16. The method of claim 12, wherein the metallic bond pads on the substrate die and the metallic bond pads on the chiplet are disposed each in a two dimensional (2D) periodic pattern formed thereon.

17. The method of claim 16, wherein the 2D periodic pattern has a circular symmetry.

18. The method of claim 12, wherein the dual-directional illumination comprises illumination at a first oblique angle and a second oblique angle that are orthogonal to each other.

19. The method of claim 12, wherein the dual-directional illumination uses two light sources each comprising a uni-directional or nearly uni-directional laser or light emitting diode (LED).

20. The method of claim 12, wherein the generating the dual optical images of the surface of the substrate die and the surface of the chiplet comprises a time delay integration (TDI) scanning of the surface of the substrate die and the surface of the chiplet.

* * * * *